United States Patent
Fang

[19]

[11] Patent Number: 6,118,499
[45] Date of Patent: Sep. 12, 2000

[54] DIGITAL TELEVISION SIGNAL RECEIVER

[75] Inventor: George Fang, Tokyo, Japan

[73] Assignee: Mitsubishi Denki Kabushiki Kaisha, Tokyo, Japan

[21] Appl. No.: 08/858,815

[22] Filed: May 19, 1997

[51] Int. Cl.[7] .............................. H04N 5/46; H04N 5/44
[52] U.S. Cl. ..................... 348/726; 348/735; 348/731; 455/189.1; 455/245.2; 455/207
[58] Field of Search ................... 348/554, 555, 348/556, 725, 726, 728, 735, 737, 707, 731, 678, 432; 455/209, 207, 208, 258, 318, 265, 245.1, 245.2, 189.1, 190.1, 192.2, 192.3; H04N 5/44, 5/46, 5/52, 5/50, 5/455

[56] References Cited

U.S. PATENT DOCUMENTS

| | | | |
|---|---|---|---|
| 4,633,315 | 12/1986 | Kasperkovitz | 358/188 |
| 4,789,897 | 12/1988 | Kappeler et al. | 358/188 |
| 4,901,151 | 2/1990 | Mehrgardt et al. | 348/725 |
| 5,390,346 | 2/1995 | Marz | 455/260 |
| 5,548,344 | 8/1996 | Park | 348/726 |
| 5,572,264 | 11/1996 | Mizukami et al. | 348/735 |
| 5,841,814 | 11/1998 | Cupo | 348/726 |

*Primary Examiner*—Michael H. Lee

[57] ABSTRACT

A first mixer outputs a TV signal of a first intermediate frequency (the first IF) by up-converting an input signal. A second mixer outputs a TV signal of the second intermediate frequency (the second IF) by down-converting the TV signal of the first IF. The second IF is chosen to be different and below the conventional intermediate frequency used by single super-heterodyne analog TV tuners. By choosing a sufficiently low second IF, the passband signal can be directly sampled by an analog to digital converter after being filtered by a low pass filter. Thus, a digital television broadcast receiver tuner is achieved which can be used with a direct passband sampling type digital demodulator.

18 Claims, 2 Drawing Sheets

DIGITAL TELEVISION SIGNAL RECEIVER

BACKGROUND OF THE INVENTION

1. Field of the Invention

The present invention relates to a receiver which can receive terrestrial broadcast or cable distributed digital television (TV) signals, and more particularly to the reception of digital TV signals that are modulated with any of the following methods: the VSB (Vestigial Side Band) modulation method, the QAM (Quadrature Amplitude Modulation) modulation method, and the COFDM (Coded Orthogonal Frequency Division Multiplexed) modulation method.

2. Description of the Background Art

As terrestrial TV broadcast signals change from present day analog signals, such as NTSC, to any of the above digital signal modulation forms, it will become easier to broadcast different TV signals on a series of consecutive adjacent channels as well as on the previously unusable "taboo" channels, thereby increasing the utilization rate of the available channels.

Most present day television receivers employ a single super-heterodyne type tuner which is adequate for the presently sparsely utilized terrestrial frequency spectrum. When the spectrum is filled with consecutive channels of TV signals and the "taboo" channels are used, much like that in a cable TV distribution system, some digital TV signal receivers will employ a dual super-heterodyne type tuner in place of the commonly used single super-heterodyne type to reduce interference in the reception of the desired channel. Such dual super-heterodyne type tuners are designed with the output intermediate frequency signal occupying the same frequency as the single super-heterodyne type tuner's output in order to minimize changes to other parts of the receiver.

In some digital TV signal receivers, the intermediate frequency output of the above dual super-heterodyne tuner is further subjected to one more super-heterodyne process of shifting the tuner's output intermediate frequency signal to an even lower frequency band due to the requirements of the type of signal demodulator or signal processor employed by the receiver system subsequent to the tuner.

One known dual super-heterodyne type tuner designed to receive digital TV broadcast signals is described, for example, by Mizukami et al, in U.S. Pat. No. 5,572,264. According to Mizukami et al, a TV signal is frequency converted a total of three times in total before entering a demodulator. While this method achieves reception of the digital TV signal, it is not an optimum system in terms of minimizing signal distortion. Specifically, local oscillators' phase noise which reduces the performance of the demodulator is introduced into the desired TV signal at three points of the signal path, i.e., at each of the frequency conversion processes performed by mixers.

In such receiver systems, the digital TV signal is frequency-converted a total of three times, and two of the three frequency conversions are consecutive down-conversations.

SUMMARY OF THE INVENTION

The present invention is directed to a digital television broadcast receiver. According to the present invention, the digital television broadcast receiver comprises: a pre-filter which receives an input TV signal which has previously been digitally-modulated, for passing a TV signal of desired band out of the input TV signal; a first amplifier for amplifying the TV signal after passing through the pre-filter; a first frequency converter for receiving the TV signal amplified by the first amplifier, and up-converting a frequency an of the TV signal to a first intermediate frequency; amplifier/filter for amplifying the TV signal of the first intermediate frequency and filtering the TV signal at a first bandwidth; a second frequency converter for receiving the TV signal of the amplified/filtered first intermediate frequency from the amplifier/filter means and down-converting the first intermediate frequency to a second intermediate frequency; a second amplifier for amplifying the TV signal of the second intermediate frequency; a low pass filter for rejecting a high frequency component of the TV signal of the second intermediate frequency amplified by the second amplifier; an A/D converter for A/D-converting the TV signal of the second intermediate frequency after passing through the low pass filter to output a sampled TV signal; a digital filter for filtering the sampled TV signal at a second bandwidth; and a demodulator for demodulating the sampled TV signal after passing through the digital filter. In the digital television broadcast receiver of the present invention, the second intermediate frequency is set to a frequency which the A/D converter can be A/D-converted.

In the present invention, the frequency band occupied by the TV signal after the down-conversion by the second frequency converter is referred to as the "second intermediate frequency" or "second IF", and is characterized as being different and below the intermediate frequency range (for example: 41 to 47 MHz in U.S. televisions) commonly used by present single and dual super-heterodyne type tuners. Typical selections of the "second IF" in the present invention result in the passband signal of the desired channel being completely below 20 MHz. Additionally, the desired TV channel's signal never has to be processed at the conventional "Intermediate Frequency" (e.g., 41 to 47 MHz in U.S. televisions) in the present invention.

Accordingly, the second IF of the TV signal is at a sufficiently low frequency so as to be directly sampled with an analog to digital conversion device after an appropriate band limiting via low pass filtering.

As a result, in the present invention, reduction of the phase noise introduced into the desired TV signal due to the dual super-heterodyne tuner is achieved by eliminating one of the three conventional frequency conversion stages discussed above.

An object of the present invention is to provide a digital TV broadcast receiver tuner to be used with a direct passband sampling type digital demodulator.

These and other objects, features, aspects and advantages of the present invention will become more apparent from the following detailed description of the present invention when taken in conjunction with the accompanying drawings.

DESCRIPTION OF THE PREFERRED EMBODIMENTS

The First Preferred Embodiment

The first preferred embodiment of the present invention will be described blow with reference to the accompanying drawings.

Figure 1:
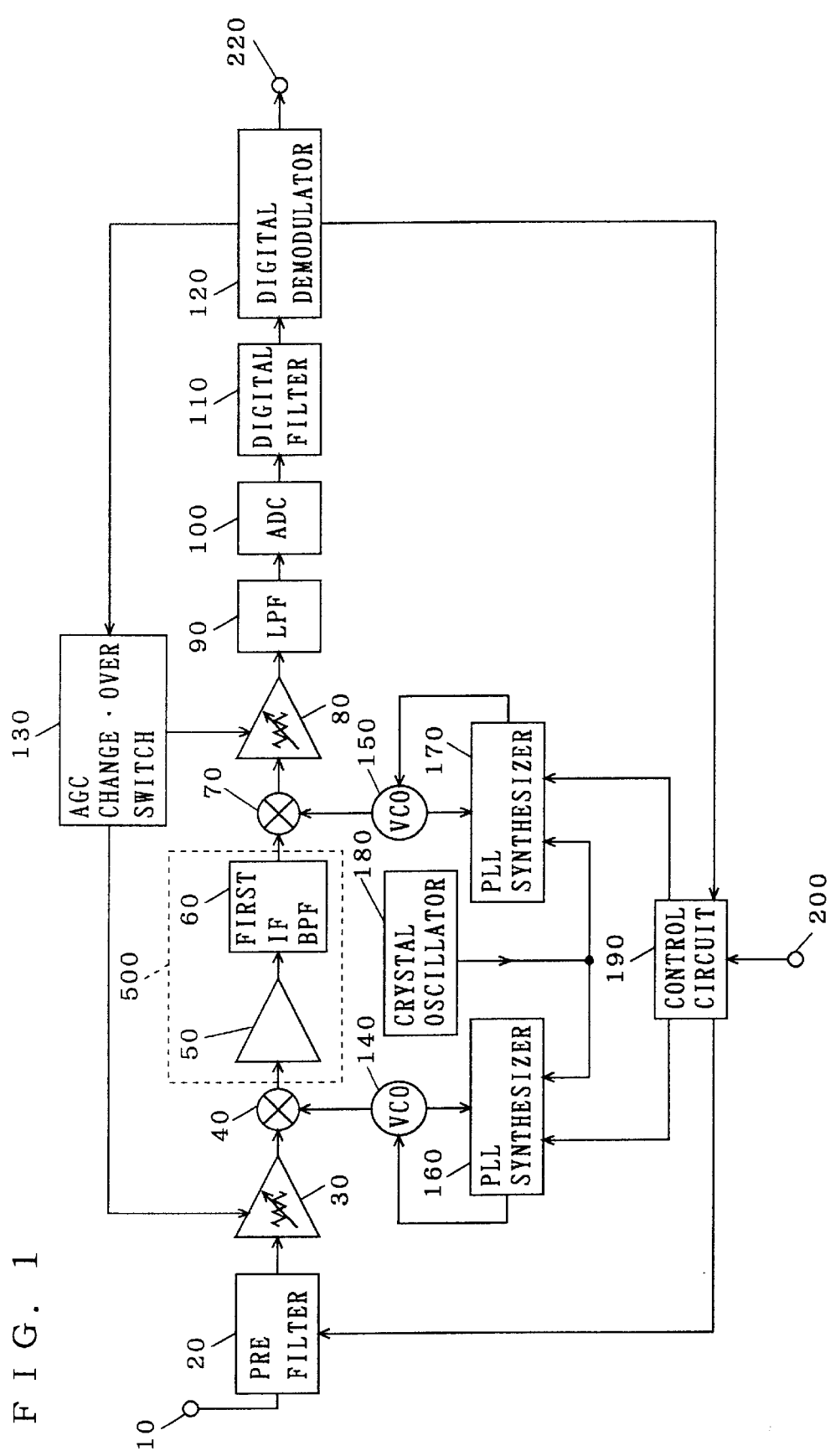
FIG. 1 is a block diagram showing a digital TV signal receiver in accordance with a first embodiment of the present invention.

FIG. 1 is a block diagram showing the first embodiment of the digital TV signal receiver of the present invention. The digital TV signal receiver of FIG. 1 includes a TV signal input terminal 10, an input pre-filter 20, a variable gain amplifier 30, a mixer 40, a first intermediate frequency amplifier 50, a first intermediate frequency band pass filter 60, a mixer 70, a second intermediate frequency variable gain amplifier 80, a low pass filter 90, an analog to digital converter 100, a digital filter 110, a digital demodulator 120, an automatic gain control switch-over circuit 130, voltage control local oscillators (VCO) 140 and 150, phase lock loop (PLL) synthesizers 160 and 170, a reference crystal oscillator 180, a control circuit 190, a channel selection signal input terminal 200 and a compressed digital TV signal output terminal 220. The VCO 140, the PLL synthesizer 160 and the reference crystal oscillator 180 constitute a PLL circuit, and the VCO 150, the PLL synthesizer 170 and the reference crystal oscillator 180 constitute another PLL circuit.

In operation, a broadcast digital TV signal, i.e., a modulated radio frequency signal from an antenna or a cable distribution system, is inputted to the terminal 10. The signal is first filtered by the pre-filter 20 which is generally a band pass filter. (Its actual construction can be either a group of fixed frequency band pass filters, or a tracking type filter.) The pre-filter 20 reduces the bandwidth of the signal entering the subsequent variable gain amplifier 30, equivalent to reducing the number of channels amplified by the amplifier 30, thereby reducing the intermodulation interference generated by the amplifier 30 and subsequent circuits. In a group of fixed frequency band pass type pre-filter, the proper band is selected according to the desired channel information inputted through the terminal 200 and controlled by the control circuit 190. Alternatively, in a tracking type pre-filter, an analog control voltage is generated by the control circuit 190 according to the desired channel information from the terminal 200.

The output of the pre-filter 20 is amplified or attenuated to a desired level by the variable gain amplifier 30 and inputted to the mixer 40. At the other input of the mixer 40 is a local oscillation signal from the voltage controlled oscillator (VCO) 140. The control signal for the VCO 140 is generated by the PLL synthesizer 160 which compares the phase of a frequency-divided signal from the VCO 140 to that of a frequency-divided signal from the reference crystal oscillator 180, and produces an analog voltage to control the oscillation frequency of the VCO 140 so that the phases of the two frequency-divided signals are synchronized. The frequency division ratio for the VCO 140 signal is further controlled by the control circuit 190 through the PLL synthesizer 160 according to the desired channel information from the terminal 200, thus achieving a channel selection mechanism by varying the oscillation frequency of the VCO 140. The frequency division ratio for the VCO 140 signal is also controlled by the control circuit 190 through the PLL synthesizer 160 according to a frequency fine tuning signal from the demodulator 120, thus achieving a fine tuning mechanism by varying the oscillation frequency of the VCO 140.

The signal at the output of mixer 40, which is a mixture of the VCO 140 signal and the desired TV channel signal, is defined as the first intermediate frequency (first IF) signal (the frequency which is the numerical difference between the VCO 140 signal and the desired channel's frequency). Since the mixers 40 shifts the spectrum of the desired TV channel to a frequency higher than the broadcasted frequency, this operation is referred to as an up-conversion.

The first IF is chosen to be above all of the spectrum used by terrestrial or cable distribution TV broadcasting in the particular environment in which the tuner operates in. By this choice, the image frequency (the frequency which is the numerical sum of the VCO 140 signal and the first IF frequency) of the up-conversion process can be rejected by the pre-filter 20. This choice of the first IF frequency also puts the frequency of the VCO 140 above the spectrum used by the TV broadcast, thereby reducing other possible interference.

The first IF output signal of the mixer 40 is amplified by the narrow band amplifier 50 and then supplied to the first IF band pass filter (first IF BPF) 60 such as a dielectric resonance filter, a strip-line filter or a SAW (Surface Acoustic Wave) filter. The characteristics of the first IF BPF 60 are designed, with consideration to the characteristics of the subsequent digital filter 110, such that the first IF BPF's bandwidth is no less than that of a single digital TV channel, and the pass band group delay response is sufficiently linear so as not to cause adverse effects on the performance of the subsequent demodulator 120. Furthermore, the first IF BPF 60 is designed to have sufficient out-of-band attenuation at the image frequency range of the subsequent down-conversion process by the mixer 70 so as not to introduce excessive image frequency interference to degrade the performance of the demodulator 120. Specifically, at the first IF, the desired channel of TV signal is filtered by the band pass filter 60 whose bandwidth is designed to be as close to the bandwidth occupied by the desired TV broadcast channel as possible, but not too wide or too narrow as to degrade the performance of the subsequent demodulator 120 in the system. The group delay's non-linear characteristic of the band pass filter 60 is also designed to be minimal so as not to degrade the performance of the subsequent demodulator 120 in the system. This band pass filter 60 also must provide sufficient stop-band attenuation at the image frequency range of the subsequent down-conversion process, so as not to introduce excessive image frequency interference to degrade the performance of the subsequent demodulator 120 in the system. Notice that within the dotted line box 500, isolating the narrow band amplifier 50 and the first IF BPF 60, the positions of the narrow band amplifier 50 and the first IF band pass filter 60 can be interchanged in similar designs without effecting the function of the tuner.

The output of the first IF BPF 60 is a signal which consists mostly of only the desired TV channel signal, with a small amount of adjacent channel signal which cannot be completely attenuated due to the BPF's band edge roll-off characteristics. This signal is inputted to the mixer 70, or in a similar design tuner, amplified by the narrow band amplifier 50 before being inputted to the mixer 70. At the other input of the mixer 70 is a local oscillation signal from the voltage controlled oscillator (VCO) 150. The control signal for the VCO 150 is generated by the PLL synthesizer 170, which compares the phase of a frequency-divided signal from the VCO 150 to that of a frequency-divided signal from the reference crystal oscillator 180, and produces an analog voltage to control the oscillation frequency of the VCO 150 so that the phases of the two frequency-divided signals are synchronized. The frequency division ratio for the VCO 150 signal is set to a predetermined value by the control circuit 190 and remains unchanged during normal operation of the tuner, thus achieving a fixed relationship for the combined response of the first IF BPF 60 and the subsequent digital filter 110.

The signal at the output of the mixer 70, which is a mixture of the VCO 150 signal and the first IF, is defined as the second intermediate frequency (second IF) signal (the frequency which is the numerical difference between the VCO 150 signal and the first IF). The second intermediate frequency at the output of the mixer 70 enters the variable gain amplifier 80. This variable gain amplifier 80 has a faster gain control response as compared to the variable gain amplifier 30. By using a faster gain control response variable gain amplifier as element 80, variable gain amplifier 30 can be designed with less difficulty. This is due to the sharing of the required gain control response speed between 30 and 80. Typically the variable gain control amplifier 30 responds to slowly-varying input signal amplitude at the input terminal 10, while the variable gain amplifier 80 responds to fast-varying input signal amplitude. The final objective of the variable gain amplifiers 30 and 80 is to maintain an equal amplitude of the desired signal entering the analog to digital converter 100.

Since the mixer 70 shifts the first IF signal to a lower frequency, this operation is referred to as a down-conversion. The second IF is chosen to be different and below the conventional intermediate frequency used by single super-heterodyne analog TV tuners. By this choice of a sufficiently low second IF frequency, the passband signal can be directly sampled by the analog to digital converter 100, after being filtered by the low pass filter 90. The low pass filter 90 is designed to have flat frequency and group delay pass band characteristics for the frequency range occupied by the desired TV channel's signal at the second IF, and also to provide sufficient rejection of undesired higher frequency signals so that the aliasing interference of the analog to digital conversion does not degrade the performance of the subsequent demodulator 120.

At this point of the dual super-heterodyne tuner, the desired TV channel signal has been frequency converted only twice. This is in contrast to the three conversions described in the receiver by Mizukami et al, in U.S. Pat. No. 5,572,264. The advantage of eliminating one of the conversion stages, and associated signal processing at that particular stage, is that of phase noise introduced into the desired TV signal is reduced. With less phase noise, the subsequent demodulator 120 can successfully recover the digital data at an even weaker signal level entering the receiver as compared to the receiver proposed by Mizukami et al.

The output of the analog to digital converter 100 is a digital representation of the desired digital TV signal at the second IF frequency in the form of a passband signal with the addition of some adjacent channel signal not attenuated by the earlier first IF BPF 60. This digital signal is filtered by the digital filter 110. The digital filter 110 is designed to remove the remaining adjacent channel signal and shape the band edge roll-off characteristic of the passband digital TV signal to conform with the required raised cosine curve in order to be properly demodulated by the following demodulator 120 without excessive inter-symbol interference. The digital filter 110 is also designed to equalize the overall non-linear signal group delays incurred by all previous stages to produce a nearly flat final group delay characteristic with a minimum amount of ripple. Specifically, the digital filter 110 is designed to provide further adjacent channel attenuation in addition to the filtering accomplished by the first IF band pass filter 60. The digital filter 110 is also designed, in tandem with characteristics of the first IF band pass filter 60, to shape the roll-off response at the passband band edges and equalize the non-linear group delay characteristics in the passband of the first IF band pass filter 60, as required by the subsequent demodulator in order to reproduce a baseband signal with minimum inter-symbol distor-tions. Furthermore, the digital filter 110 is designed to have deep attenuation notches or frequency traps for the frequencies corresponding to the video, audio, and chrominance carriers of the adjacent analog TV channels, thereby further reducing adjacent channel interference.

The output of the digital filter 110 is inputted to the digital demodulator 120 which reconstructs the original compressed digital TV signal and outputs through the terminal 220.

The demodulator 120 also generates an automatic gain control (AGC) signal and an automatic frequency fine tuning signal. The AGC signal is supplied to the AGC switch-over circuit 130. At the AGC switch-over circuit 130, two signals are produced to control the gain/attenuation of the variable gain amplifiers 30 and 80. The steady state control algorithm for the variable gain amplifiers 30 and 80 is such that, for a given total tuner system gain required to receive a digital TV broadcast signal as determined by the digital demodulator 120, the gain is first distributed to the variable gain amplifier 30 while holding the variable gain amplifier 80 at a predetermined low gain state. When the required total tuner system gain exceeds the gain obtainable from the variable gain amplifier 30, the remaining is then distributed to the variable gain amplifier 80. With this control algorithm, the noise figure of the entire tuner can be optimized to its minimum.

In the transient response characteristic of the AGC system, the response time constant for the control voltage supplied to the variable gain amplifier 30 is designed to be relatively long as compared to that of the variable gain amplifier 80. With this design, only the variable gain amplifier 80 needs to have very fast response characteristics, thereby simplifying circuit complexity.

The automatic frequency fine tuning control signal from the digital demodulator 120 is supplied to the control circuit 190. This signal indicates the amount of frequency offset the second IF has with respect to a chosen reference value. The control circuit 190 uses this signal to change the frequency division ratio for the signal from the local oscillator 140 inside the PLL synthesizer 160, thereby changing the oscillation frequency of the local oscillator 140, which in turn causes a corresponding change in the first IF and eventually the second IF frequency to approach the chosen reference value determined by the digital demodulator 120. On other types of demodulators, the automatic fine tuning signal may only be an indication of whether the second IF signal is within a predetermined frequency range. In this case, the control circuit 190 will attempt to change the frequency of the second IF until it is within the specified frequency range according to an internal algorithm.

The Second Preferred Embodiment

Figure 2:
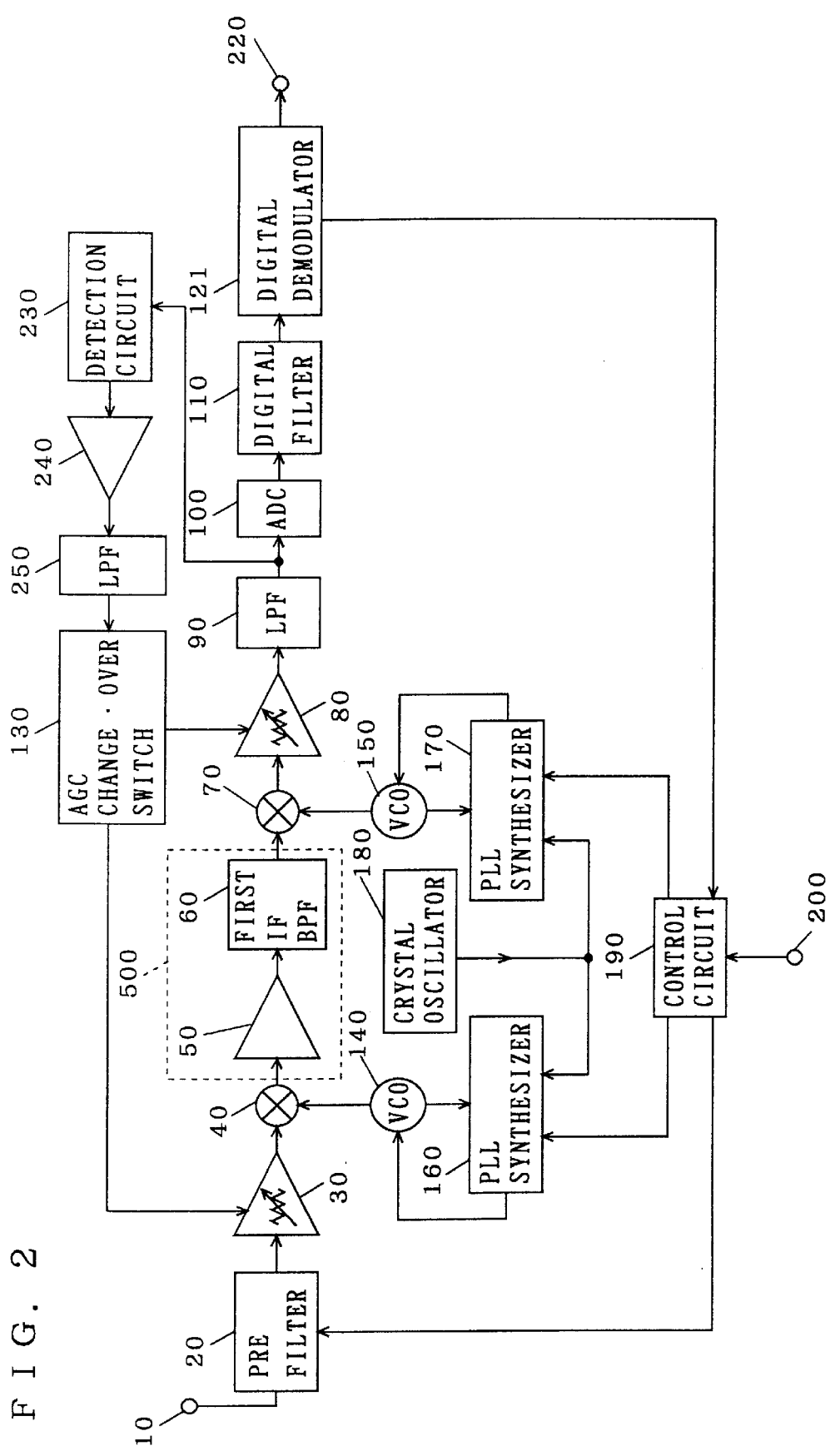
FIG. 2 is a block diagram showing a digital TV signal receiver in accordance with a second embodiment of the present invention.

The second preferred embodiment of the invention is shown in FIG. 2. In this embodiment, the digital demodulator 120 does not provide the automatic gain control signal output. Instead this signal is provided by a detection circuit 230, an amplifier 240, and a low pass filter 250. The detection circuit 230 is an envelope detector and provides an output analog voltage proportional to the amplitude of the low pass filtered second intermediate frequency signal before entering the analog to digital converter 100.

This signal is amplified to a suitable amplitude, for controlling the gain of the variable gain amplifiers 30 and 80 by the amplifier 240, then low pass filtered by the filter 250 before being inputted to the AGC switch-over switch 130. Again, the objective of the variable gain amplifiers 30 and 80 is to maintain an equal amplitude of the desired signal entering the analog to digital converter 100. By controlling the gain of the variable gain amplifiers according to the amplitude of the second IF signal before entering the analog to digital converter 100 as detected by the detection circuit 230, the same objective can be achieved. The low pass filter 250 is designed according to a desired automatic gain control transient response for a particular digital television receiver operation environment.

While the invention has been shown and described in detail, the foregoing description is in all aspects illustrative and not restrictive. It is therefore understood that numerous modifications and variations can be devised without departing from the scope of the invention.

I claim:

1. A digital television broadcast receiver, comprising:
   a pre-filter for receiving and band-pass filtering an input digitally-modulated TV signal;
   a first amplifier for amplifying the output of said pre-filter;
   a first frequency converter for receiving the output of said pre-filter, and up-converting a frequency of the output of said pre-filter to a first intermediate frequency to output a TV signal of said first intermediate frequency;
   an amplifier/filter for amplifying said TV signal of said first intermediate frequency and filtering said TV signal of said first intermediate frequency at a first bandwidth to output an amplified/filtered TV signal of said first intermediate frequency;
   a second frequency converter for down-converting said amplified/filtered TV signal of said first intermediate frequency to a second intermediate frequency to output a TV signal of said second intermediate frequency;
   a second amplifier for amplifying said TV signal of said second intermediate frequency;
   a low pass filter for rejecting high frequency components from said TV signal of said second intermediate frequency;
   an A/D converter means for AND-converting said TV signal of said second intermediate frequency to output a sampled TV signal;
   a digital filter for filtering said sampled TV signal at a second bandwidth to output a sampled, digitally filtered TV signal; and
   a demodulator for demodulating said sampled, digitally filtered TV signal,
   wherein said second intermediate frequency is set to a frequency based on sampling characteristics of said A/D converter.

2. The digital television broadcast receiver of claim 1, wherein
   said first and second bandwidths include bandwidths close to a bandwidth occupied by a single TV broadcast channel, and
   said digital filter has a roll-off characteristic at the passband edge which reduces inter-symbol interference produced in the demodulator.

3. The digital television broadcast receiver of claim 1, wherein
   said demodulator means outputs a gain control signal based on said sampled TV signal after passing through said digital filter, and
   said digital television broadcast receiver further comprises a gain controller for receiving said gain control signal and controlling respective gains of said first and second amplifiers based on said gain control signal.

4. The digital television broadcast receiver of claim 1, wherein
   said first frequency converter includes
      a first local oscillator for outputting a first local oscillation signal at a first oscillation frequency, and
      a first mixer for mixing said TV signal amplified by said first amplifier and said first local oscillation signal to output said TV signal of said first intermediate frequency,
   said second frequency converter includes
      a second local oscillator for outputting a second local oscillation signal at a second oscillation frequency, and
      a second mixer for mixing said TV signal of said first intermediate frequency and said second local oscillation signal to output said TV signal of said second intermediate frequency,
   said demodulator further outputs a second intermediate frequency offset indication signal based on said sampled, digitally sampled TV signal, said second intermediate frequency offset indication signal indicating a difference between said second intermediate frequency and a predetermined reference value, and
   said digital television broadcast receiver further comprises an intermediate frequency controller receiving channel selection information and said second intermediate frequency offset indication signal, for variably-controlling said first intermediate frequency based on said channel selection information and said second intermediate frequency offset indication signal and fixedly-controlling said second intermediate frequency.

5. The digital television broadcast receiver of claim 4, wherein said amplifier/filter includes
   a third amplifier for amplifying said TV signal of said first intermediate frequency, and
   a band pass filter for filtering said TV signal of said first intermediate frequency amplified by said third amplifier at said first bandwidth.

6. The digital television broadcast receiver of claim 5, wherein said band filter is a dielectric resonance filter, a strip-line filter or a SAW filter.

7. The digital television broadcast receiver of claim 6, wherein
   said amplifier/filter includes
      a band pass filter for filtering said TV signal of said first intermediate frequency at said first bandwidth, and
      a third amplifier for amplifying said TV signal of said first intermediate frequency after passing through said band pass filter.

8. The digital television broadcast receiver of claim 7, wherein said band pass filter is a dielectric resonance filter, a strip-line filter or a SAW filter.

9. The digital television broadcast receiver of claim 4, wherein
   said intermediate frequency controller further controls said desired band of said pre-filter based on said channel selection information.

10. The digital television broadcast receiver of claim 1, further comprising:
   a detection circuit for outputting a detection signal based on an amplitude of said TV signal of said second intermediate frequency after passing through said low pass filter;
   a detection amplifier for amplifying said detection signal;
   a detection filter for filtering said detection signal amplified by said detection amplifier; and
   a gain controller for controlling respective gains of said first and second amplifiers based on said detection signal after passing through said detection filter.

11. The digital television broadcast receiver of claim 10, wherein said first frequency converter includes
   a first local oscillator for outputting a first local oscillation signal at a first oscillation frequency, and
   a first mixer for mixing said TV signal amplified by said first amplifier and said first local oscillation signal to output said TV signal of said first intermediate frequency,
said second frequency converter includes
   a second local oscillator for outputting a second local oscillation signal at a second oscillation frequency, and
   a second mixer for mixing said TV signal of said first intermediate frequency and said second local oscillation signal to output said TV signal of said second intermediate frequency,
said demodulator further outputs a second intermediate frequency offset indication signal based on said sampled TV signal after passing through said digital filter, said second intermediate frequency offset indication signal indicating a difference between said second intermediate frequency and a predetermined reference value, and
said digital television broadcast receiver further comprises an intermediate frequency controller receiving channel selection information and said second intermediate frequency offset indication signal, for variably-controlling said first intermediate frequency based on said channel selection information and said second intermediate frequency offset indication signal and fixedly-controlling said second intermediate frequency.

12. The digital television broadcast receiver of claim 11, wherein said amplifier/filter includes
   a third amplifier for amplifying said TV signal of said first intermediate frequency, and
   a band pass filter for filtering said TV signal of said first intermediate frequency amplified by said third amplifier at said first bandwidth.

13. The digital television broadcast receiver of claim 12, wherein said band pass filter is a dielectric resonance filter, a strip-line filter or a SAW filter.

14. The digital television broadcast receiver of claim 11, wherein
   said amplifier/filter includes
      a band pass filter for filtering said TV signal of said first intermediate frequency at said first bandwidth, and
      a third amplifier for amplifying said TV signal of said first intermediate frequency after passing through said band pass filter.

15. The digital television broadcast receiver of claim 14, wherein said band pass filter is a dielectric resonance filter, a strip-line filter or a SAW filter.

16. The digital television broadcast receiver of claim 11, wherein
   said intermediate frequency controller further controls said desired band of said pre-filter based on said channel selection information.

17. A method for receiving a digital broadcast, comprising:
   pre-filtering and input digitally-modulated TV signal;
   amplifying the output of said pre-filtering step;
   receiving the output of said pre-filtering step and up-converting a frequency of the output of said pre-filtering step to a first intermediate frequency to output a TV signal of said first intermediate frequency;
   amplifying said TV signal of said first intermediate frequency;
   filtering said TV signal of said first intermediate frequency at a first bandwidth to output an amplified/filtered TV signal of said first intermediate frequency;
   down-converting said amplified/filtered TV signal of said first intermediate frequency to a second intermediate frequency to output a TV signal of said second intermediate frequency;
   amplifying said TV signal of said second intermediate frequency;
   low-pass filtering said TV signal of said second intermediate frequency; and
   analog-to-digital converting the amplified/filtered TV signal of said second intermediate frequency to output a sampled TV signal;
   digitally filtering said sampled TV signal at a second bandwidth to output a sampled, digitally filtered TV signal; and
   demodulating said sampled, digitally filtered TV signal, wherein
      said second intermediate frequency is set to a frequency based on sampling characteristics of said analog-to-digital converting step.

18. The method of 17, further comprising:
   generating a gain control signal based on the output of said digitally filtering step; and
   controlling respective gains of said steps of amplifying said TV signal of said first intermediate frequency and amplifying said TV signal of said second intermediate frequency.

* * * * *